(12) United States Patent
Holland

(10) Patent No.: US 7,061,248 B1
(45) Date of Patent: Jun. 13, 2006

(54) ELECTRICAL UTILITY SERVICE TESTER

(76) Inventor: Charles F. Holland, 564 S. Rochester, Mesa, AZ (US) 85206

(*) Notice: Subject to any disclaimer, the term of this patent is extended or adjusted under 35 U.S.C. 154(b) by 0 days.

(21) Appl. No.: 11/234,580

(22) Filed: Sep. 23, 2005

(51) Int. Cl.
G01R 31/00 (2006.01)
G01R 31/14 (2006.01)

(52) U.S. Cl. .............. 324/508; 324/511
(58) Field of Classification Search .......... 324/508, 324/511
See application file for complete search history.

(56) References Cited

U.S. PATENT DOCUMENTS

| | | | | |
|---|---|---|---|---|
| 4,164,701 A | * | 8/1979 | Gulledge et al. | 324/508 |
| 5,285,163 A | * | 2/1994 | Liotta | 324/508 |
| 5,331,283 A | * | 7/1994 | Sheldon | 324/508 |
| 6,731,217 B1 | * | 5/2004 | Warner | 340/650 |

* cited by examiner

Primary Examiner—Anjan K. Deb
Assistant Examiner—John Teresinski
(74) Attorney, Agent, or Firm—John D. Lister

(57) ABSTRACT

An electrical utility service tester that is used for troubleshooting 120/208 or 120/240, three phase or single phase alternating current electrical utility services where 120 volt hot leg leads of the electrical utility services are connected 120 volts to ground only. The tester is self-contained in a weatherproof case, which enables the tester to withstand exposure to adverse weather conditions without damage or loss of function. The tester also includes circuitry for preventing damage to the electrical circuitry of the tester by preventing the test circuitry for the left and right hot legs of a circuit under test from being simultaneously operative and the test load circuitry for intermittent and continuous test load application from being simultaneously operative.

6 Claims, 6 Drawing Sheets

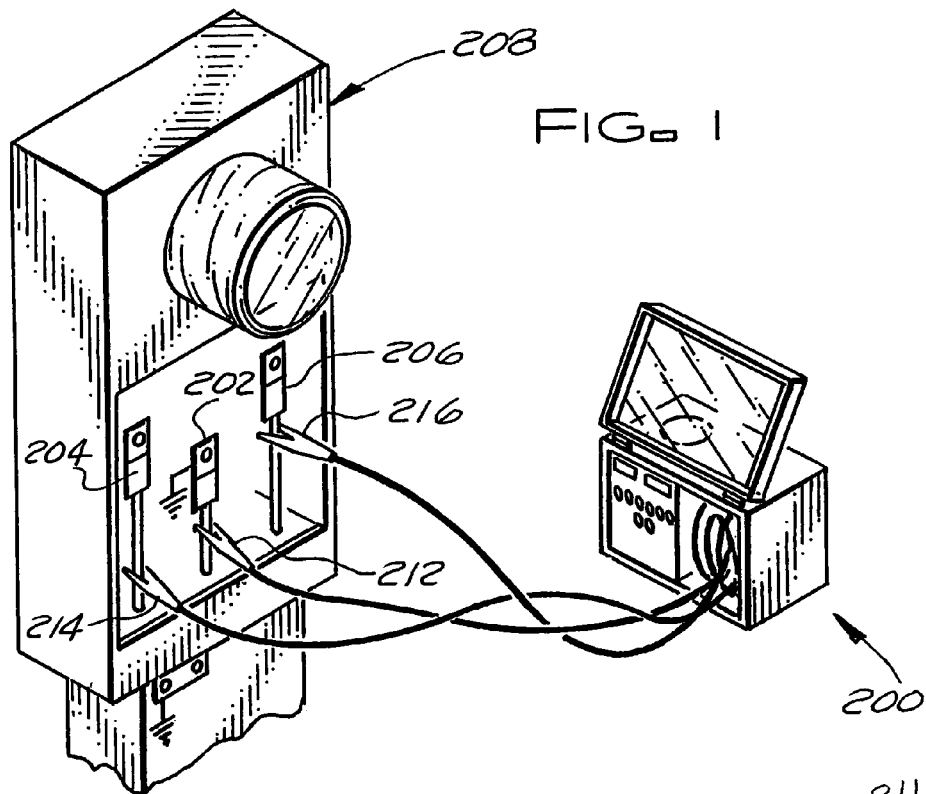
FIG. 1
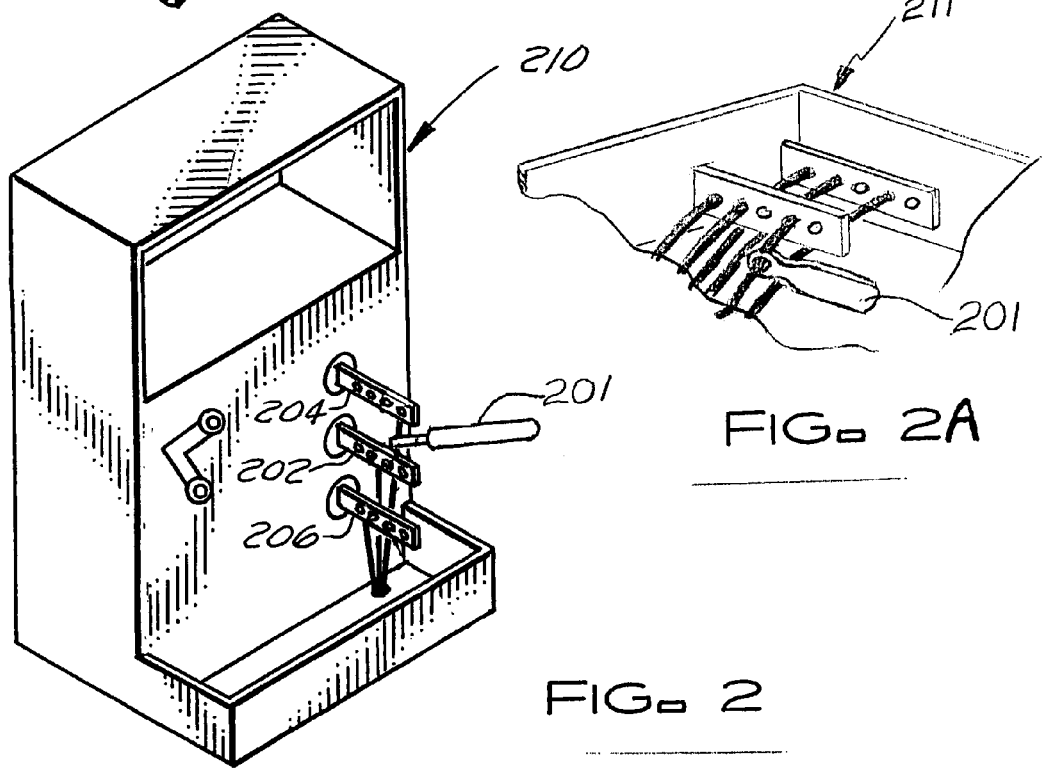
FIG. 2A
FIG. 2

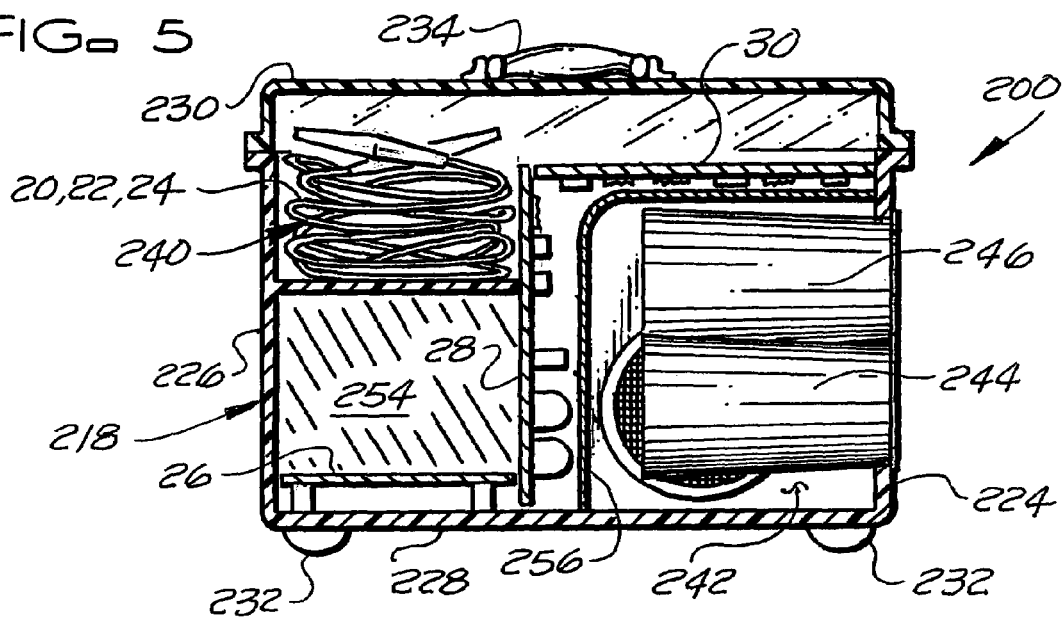
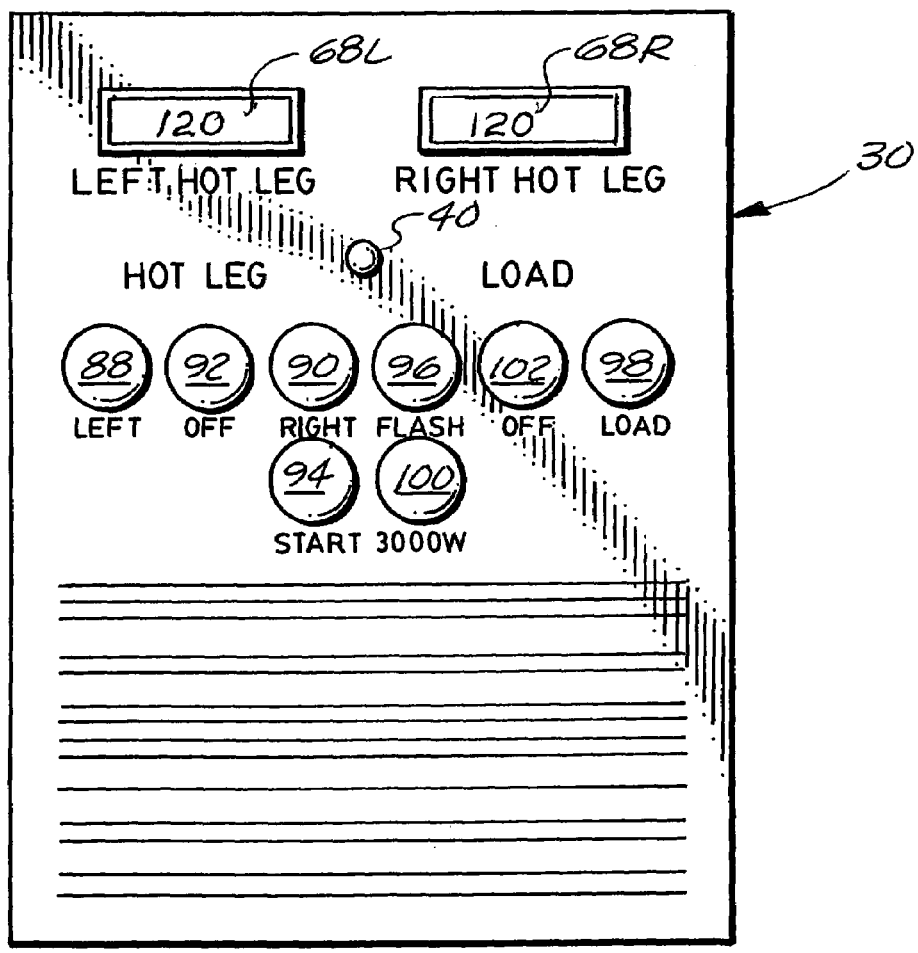

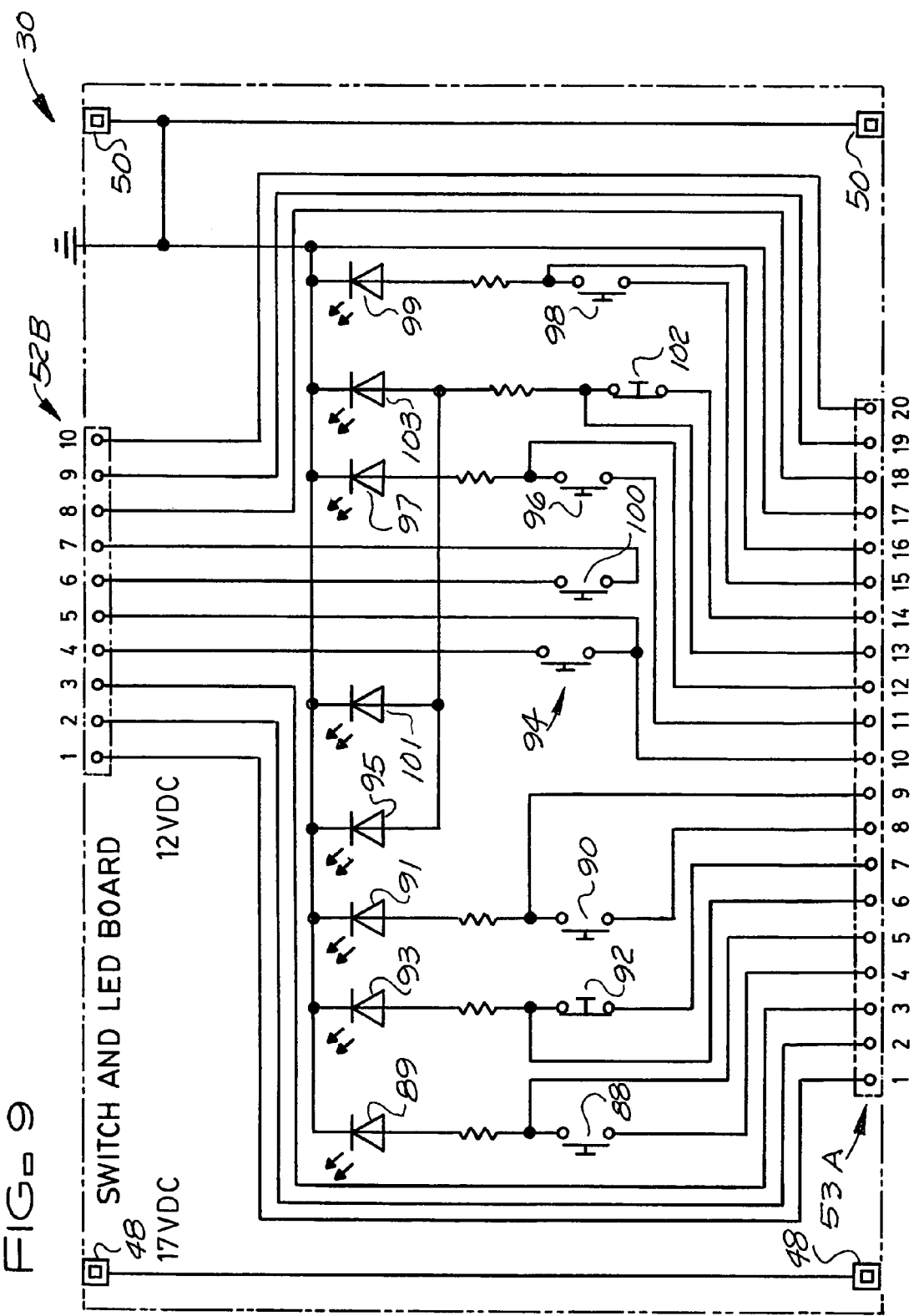

ELECTRICAL UTILITY SERVICE TESTER

BACKGROUND OF THE INVENTION

The subject invention relates to an improved electrical utility service tester that is used for troubleshooting 120/208 or 120/240, three-phase or single-phase alternating current electrical utility services where 120 volt hot legs of the electrical utility services are connected 120 volts to ground only. The tester is self-contained in a weatherproof case, which enables the tester to withstand exposure to adverse weather conditions without damage or loss of function. The tester also includes circuitry for preventing damage to the electrical circuitry of the tester by preventing the test circuitry for the left and right hot legs of a circuit under test from being simultaneously operative and the test load circuitry for intermittent and continuous test load application from being simultaneously operative.

An electrical utility service tester is typically utilized by an electrical technician to troubleshoot the electrical utility service being provided to a customer by connecting the tester to the customers service meter and running tests and, where electrical service is being provided to two or more customers from a transformer, to determine which power line at the transformer is supplying electrical service to a particular customer. When running tests on an electrical utility service to troubleshoot that service, the electrical utility service tester is used to determine whether or not the left and right hot legs of the service are shorted together; whether or not there is at least a total of 130 to 135 volts being provided by the service; whether or not the neutral leg of the service is defective; whether or not the left hot leg of the service is defective; and whether or not the right hot leg of the service is defective.

Part of the testing provided by these electrical utility service testers for testing the neutral leg, the left hot leg, and the right hot leg of a electrical utility service involves measuring the potential between the left hot leg and the neutral leg of a service under test and measuring the potential between the right hot leg and the neutral leg of a service under test. Should the test circuitry for measuring the left leg potential and the right leg potential of a service under test be operative simultaneously, even briefly, a power surge is created through a portion of the tester circuitry that can severely damage the tester circuitry.

Previous, electrical utility service testers have utilized a rocker switch for controlling the test circuitry of these testers for testing the neutral leg, the left hot leg, and the right hot leg of the electrical utility service. The rocker switch of these testers has a first off position where the test circuitry for both hot legs is turned off; a second position for turning on the test circuitry for testing the left hot leg potential; and a third position for turning on the test circuitry for testing the right hot leg potential with the first off position of the switch being intermediate the second left hot leg test circuitry on position and the third right hot leg test circuitry on position. The test circuitry of these testers for testing the neutral leg, the left leg, and the right hot leg of the electrical utility service includes relays for closing and opening the different circuits of the tester. When the test circuitry of the tester for including either the left hot leg or the right hot leg of the service in a test is turned off by the rocker switch the inclusion of these relays in the test circuitry causes a delay in the opening of the circuit being turned off. Thus, once a test including either the left or right hot leg of a service has been initiated on one of these previous testers by actuating the rocker switch to either the left or right hot leg test on position and the technician desires to test the other hot leg of the service, the rocker switch on these testers should first be returned to the intermediate off position and then, after a pause to allow the previously actuated test circuit of the tester to open, moved to the on position for closing and initiating a test with the circuitry of the tester for the other hot leg of the service. Otherwise, the test circuitry of the tester for measuring the left leg potential and the right leg potential of a service under test can become operative simultaneously thereby creating a power surge through a portion of the tester circuitry that can severely damage the tester circuitry and make the tester inoperative. As a result of the need to properly operate these previous electrical utility service testers, the careless and improper operation of these previous electrical utility service testers by a technician who attempts to rapidly change the operation of the tester from one test circuit to the other, e.g. by jabbing at the switch so that the switch moves rapidly through the off position to the on position for the other test circuit, can severely damage these testers and there has been a need to provide an electrical utility service tester where the simultaneous activation of these test circuits can not occur.

The improved electrical utility service tester of the subject invention provides the industry with an electrical utility service tester that performs all of the testing functions of previous electrical utility testers, but wherein the simultaneous activation of the test circuits to perform these functions cannot occur to damage the circuitry of the tester. In addition, the improved electrically utility service tester of the subject invention includes a weatherproof casing that protects the circuitry of the tester from adverse weather conditions so that the tester of the subject invention can withstand exposure to adverse weather conditions without damage or loss of function.

SUMMARY OF THE INVENTION

The subject invention provides an improved weatherproof electrical utility service tester that is compact, lightweight, easy to operate and use, durable, and resistant to damage even when subjected to rain and other adverse weather conditions and that can be used to quickly and easily troubleshoot 120/208 or 120/240, three-phase or single-phase alternating current electrical utility services where the 120 volt hot legs are connected 120 volts to ground only. The housing of the electrical utility service tester of the subject invention is uniquely designed to protect the circuitry and other components of the tester from adverse weather conditions, water, and rough usage and protects the circuitry and other components of the tester by utilizing an impact resistant, weatherproof casing and a weatherproof barrier within the casing to keep critical electrical components of the tester from being exposed to inclement weather conditions. Thus, the improved electrical utility service tester of the subject invention can withstand relatively rough usage and inclement conditions in the field while continuing to function properly and having a long service life.

The electrical utility service tester of the subject invention is powered by the electrical utility service being tested and is typically used to troubleshoot an electrical utility service for a particular customer at the customer's service meter, e.g. a house service meter, and/or an electrical utility service provided for a particular customer at a local transformer supplying electrical service to a number of customers including a particular customer. The electrical utility service tester of the subject invention can also be used to connect or disconnect electrical utility electrical service for a particular customer at a local transformer supplying electrical service to a number of customers by enabling a service technician to quickly and easily determine which power cable or cables from the transformer to the customers being serviced by the transformer are the power cable(s) for a particular customer.

The electrical utility service tester of the subject invention enables a technician to quickly and easily troubleshoot 120/208 or 120/240, three-phase or single-phase service alternating current electrical utility service where the 120 volt hot legs are connected 120 volts to ground only, and determine whether or not the left and right hot legs of the service are shorted together; whether or not there is at least a total of 130 to 135 volts being provided by the service; whether or not the neutral leg of the service is defective; whether or not the left hot leg of the service is defective; and whether or not the right hot leg of the service is defective. The electrical utility service tester of the subject invention includes: a neutral lead, a left hot lead, and a right hot lead for connecting the service tester to the neutral ground leg, the left hot leg, and the right hot leg, respectively, of an electrical utility service; a voltage indication light; two digital voltmeters; two approximately 3200 watt loads where one 3200 watt load can be used independently of the other 3200 watt load for testing the an electrical utility service under about a 3200 watt load or both 3200 watt loads can be used together to produce about a 6400 watt load for testing the an electrical utility service under a 6400 watt load; and control switches and circuitry for operating the electrical utility service tester to troubleshoot an electrical utility service and determine whether or not the left and right hot legs of the service are shorted together; whether or not there is at least a total of 130 to 135 volts being provided by the service; whether or not the neutral leg of the service is defective; whether or not the left hot leg of the service is defective; and whether or not the right hot leg of the service is defective.

The control switches of the electrical utility service tester of the subject invention, include: a normally open momentary left hot lead control switch; a normally open momentary right hot lead control switch; a normally closed momentary left and right hot lead off switch; a normally open momentary start switch; a normally open momentary flash test load switch; a normally open momentary constant test load switch; a normally open momentary additional test load switch; and a normally closed momentary test load off switch.

When operating the electrical utility service tester of the subject invention: the normally open momentary left hot lead control switch is manually actuated by the technician to close (with the subsequent actuation of the normally open momentary start switch and either the normally open momentary flash test load switch or the normally open momentary constant load switch) a left hot lead test circuit of the tester to test the potential between the left hot leg and neutral leg of a service under test; the normally open momentary right hot lead control switch is manually actuated by the technician to close (with the subsequent actuation of the normally open momentary start switch and either the normally open momentary flash test load switch or the normally open momentary constant load switch) a right hot lead test circuit of the tester to test the potential between the right hot leg and neutral leg of a service under test; and the normally closed momentary left and right hot lead off switch is and must be manually actuated by the technician to open a previously closed left or right hot lead test circuit and stop a test utilizing that circuit before the control switch for the other test circuit can be manually actuated by the technician to commence a test utilizing the other hot lead test circuit. In addition, the left hot lead test circuit contains a timer component that delays the completion of that circuit for a selected period of time (typically for one second) after the left hot lead control switch has been manually actuated and the right hot lead test circuit contains a timer component which delays the completion of that circuit for a selected period of time (typically for one second) after the right hot lead control switch has been manually actuated. With the need to manually actuate the left and right hot lead off control switch to open the hot lead test circuit being utilized in a test and stop the test with that hot lead test circuit before the control switch for the other hot lead test circuit can be manually actuated to initiate a test with the other hot lead test circuit and with a timer in each of the hot lead test circuits that delays the completion of the test circuit after the actuation of the control switch for that test circuit, the relay switches being opened in the hot lead test circuit of the tester being turned off are given time to fully open before the relay switches for the other hot lead test circuit are closed to initiate a test with that test circuit so that both hot lead test circuits are not and can not be simultaneously operative to create a power surge which will severely damage the tester circuitry.

When operating the electrical utility service tester of the subject invention, after the left or right hot lead control switch has been actuated, the normally open momentary start switch must be actuated before the normally open momentary flash test load switch (intermittent test load switch) or the normally open momentary constant test load switch can be actuated to include an intermittent or constant test load in the left or right hot lead test circuit being utilized in a test. Once either the flash test load switch or the constant test load switch has been actuated, the normally closed momentary test load off switch must be actuated before a test can be switched from a flash test load to a constant test load or a constant test load to a flash test load.

BRIEF DESCRIPTION OF THE DRAWINGS

FIG. 1 is a schematic perspective view of the electrical utility service tester of the subject invention connected to a customer service meter.

FIG. 2 is a schematic perspective view of a clamp-on ammeter clamped about one of the legs of an electrical utility service cable connected to a transformer, such as a transformer providing electrical utility service to a plurality of customers. The clamp-on ammeter can be used with the electrical utility service tester of the subject invention to determine which electrical utility service cables connected to the transformer are servicing which customers.

FIG. 2A is a fragmentary perspective view of a junction box with a clamp-on ammeter clamped about one of the legs of an electrical utility service cable connected to the junction box. The clamp-on ammeter can be used with the electrical utility service tester of the subject invention to determine which electrical utility service cables connected to the junction box are servicing which customers.

FIG. 5 is a vertical cross section through the electrical utility service tester of FIGS. 3 and 4, taken substantially along lines 5—5 of FIG. 3.

FIG. 6 is a top view of the control switch and LED board of the electrical utility service tester of FIGS. 3 to 5 on a larger scale than FIGS. 3 to 5.

FIG. 9 is a schematic and block circuit diagram of the switch and LED board of the electrical circuitry of a preferred embodiment of the electrical utility service tester of the subject invention.

DESCRIPTION OF THE PREFERRED EMBODIMENTS

Figure 3:
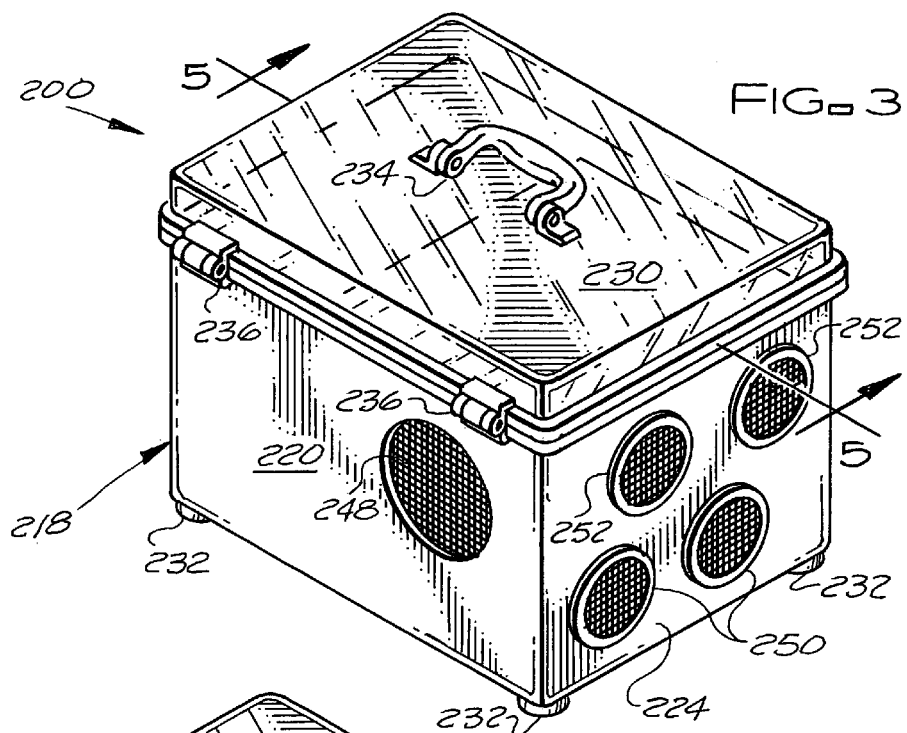
FIG. 3 is a first perspective view of a preferred embodiment of the electrical utility service tester of the subject invention showing a first side and end of the tester.
Figure 4:
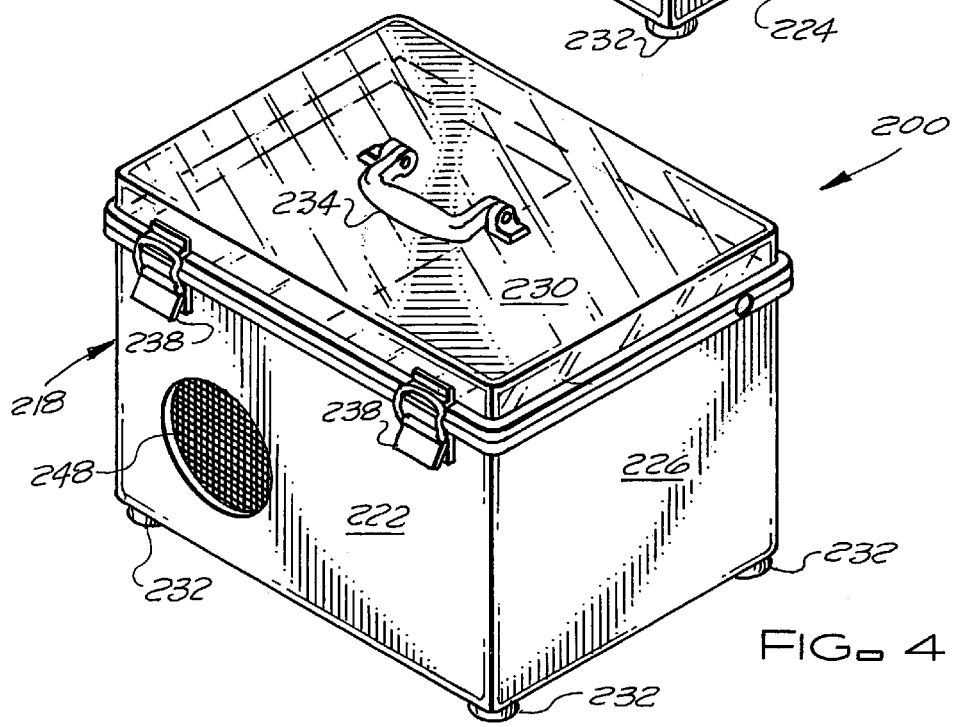
FIG. 4 is a second perspective view of a preferred embodiment of the electrical utility service tester of the subject invention with the tester turned 180° to show a second side and end of the tester.

FIG. 1 shows an electrical utility service tester 200 of the subject invention connected to the neutral leg 202, the left hot leg 204, and the right hot leg 206 of an electrical utility service at a customer electrical utility service meter 208. The neutral lead 20 of the tester 200 is connected to the neutral leg 202 of the electrical utility service with an alligator clip 212; the left hot lead 22 of the electrical utility service tester 200 is connected to the left hot leg 204 of the electrical utility service with an alligator clip 214; and the right hot lead 24 of the electrical utility service tester 200 is connected to the right hot leg 206 of the electrical utility service with an alligator clip 216. Preferably, the leads 20, 22, and 24 are 36 amp leads that are each about ten feet long.

FIG. 2 shows the conventional clamp-on-ammeter 201 connected to the left hot leg 204 of an electrical utility service at a transformer 210. By successively monitoring the neutral and hot legs of service cables with the clamp-on-ammeter 201 at the transformer to determine if the current is periodically fluctuating in the legs, the clamp-on-ammeter 201 can be used in conjunction with the electrical utility service tester 200, connected in its flash load mode to a customer service meter as shown in FIG. 1, to determine which customer is being serviced by a particular service cable.

FIG. 2A shows the conventional clamp-on-ammeter 201 clamped on a leg of an electrical utility service cable at a junction box 211. By successively monitoring the neutral and hot legs of service cables with the clamp-on-ammeter 201 at the junction box 211 to determine if the current is periodically fluctuating in the legs, the clamp-on-ammeter 201 can be used in conjunction with the electrical utility service tester 200, connected in its flash load mode to a customer service meter as shown in FIG. 1, to determine which customer is being serviced by a particular service cable. While not shown, the electrical utility service tester 200 can also be used with the conventional clamp-on ammeter 201 in a similar manner that described above to test overhead secondary service wire or cable.

The electrical utility service tester 200, which is powered by the electrical utility service being tested, is self-contained in a compact, easy to handle, durable weatherproof case 218 that protects the circuitry and electrical components of the tester so that the tester can withstand exposure to adverse weather conditions without damage or loss of function. The tester case 218 is typically about 7 inches in height, about 12 inches in length, and about 8 inches in width. The case 218 has sidewalls 220 and 222, end walls 224 and 226, a bottom wall 228, and a lid 230. Preferably, the bottom wall 228 has legs 232, about 0.25 to about 0.50 inches in height, extending down from the bottom surface of the wall so that when the tester 200 is placed on the ground or other surface the bottom wall 228 of the tester 200 is elevated above the ground. Preferably, the lid 230 of the tester 200 has a handle 234 for carrying the tester 200 and is mounted on the main portion of the case 218 by hinges 236 and quick-release latches 238 so that the lid 230 is securely attached to the case 218, but can be easily opened for access to the control switches and neon light of the control switch and LED board 30 and the tester leads 20, 22, and 24 that are normally stored in an upper tray 240 of the tester without separating the lid from the case 218. Preferably, the lid 230 is transparent so that the control switch and LED board 30 of the tester 200 can be viewed through the lid by a technician using the tester 200.

The electrical utility service tester 200 has a test load component compartment 242 that contains test load components 244 and 246 that can be incorporated into the testing circuitry of the tester 200 when running tests on a service cable of an electrical utility service. Preferably, the there are two test load components 244 that each have a heating element and fan contained in a tubular housing (such as but not limited to a heating element and fan from a conventional hair drier) for producing a first test load and there are two additional test load components 246 that each have a heating element and fan contained within a tubular housing (such as but not limited to a heating element and fan from a conventional hair drier) that can be combined with the test load components 244 to produce a second test load greater than the test load produced by the test load components 244 alone and typically a test load about twice as great as the test load produced by the test load components 244. The loads of the first and second test load components 244 and 246 are each about 3200 watts (each heating element and fan develops a load of about 1600 watts) so that when only the first load is used in a test the loading is about 3200 watts and when both loads are used in a test the loading is about 6400 watts. The case 218 of the tester 200 has a screened inlet port 248 in each of the sidewalls for admitting air into the test load component compartment 242. The test load components 244 and 246 are supported in the test load component compartment 242 with discharge ends of the components mounted in the end wall 224 of the case 218. The test load components 244 and 246 draw air in through the inlet ports 248 and discharge air out through outlet ports 250 and 252, respectively, located in the end wall 224 of the case 218. Preferably, the inlet ports 248 and the outlet ports 250, 252 are provided with fine mesh screens to inhibit rain and keep debris from being introduced into the test load component compartment 242 through these ports.

The locations of the motherboard 26, the sister board 28, and the control switch and LED board 30 in the case 218 of the electrical utility service tester 200 are best shown in FIG. 5. The motherboard 26 and the sister board 28 form the bottom wall and one sidewall of a weatherproof compartment 254 of the case 218 that houses most of the circuitry and electrical components of the motherboard and sister board. The weatherproof compartment 254 is located directly below the upper tray 240 of the tester where the neutral, left hot, and right hot leads of the tester 200 are stored. The motherboard 26 is elevated about 0.25 to about 0.50 inches above the bottom wall 228 of the tester 200 with all of the printed circuitry and electrical components of the motherboard located on the topside of motherboard so that its circuitry and components are within the compartment 254 and shielded from any water that might enter the case through the air inlet ports 248. While it is preferred to locate most or all of the printed circuitry and electrical components of the sister board 28 within the weatherproof compartment 254, at least some of the printed circuitry and electrical components of the sister board may be outside the compartment and shielded by a weatherproof shield 256 from the test load component compartment 242. The control switch and LED board 30 is located over the test load component compartment 242 with the printed circuitry of the board on the bottom side of the board. The weatherproof shield 256 is made of a waterproof sheet (e.g. a waterproof mica sheet), extends across the entire width of the case 218 between the inside surfaces of sidewalls 220 and 222, has an upper portion that is located immediately below the control switch and LED board 30 and extends from the inside surface of the end wall 224 to the sister board 28, and has a substantially vertical portion that extends from the upper end portion of the sister board 28 down to or substantially down to the bottom wall 228 of the case 218. With this structure, the weatherproof shield 256 forms a barrier so that even when the electrical utility service tester 200 is exposed to inclement weather, the tester 200 continues to operate without damage or loss of function.

Figure 7:
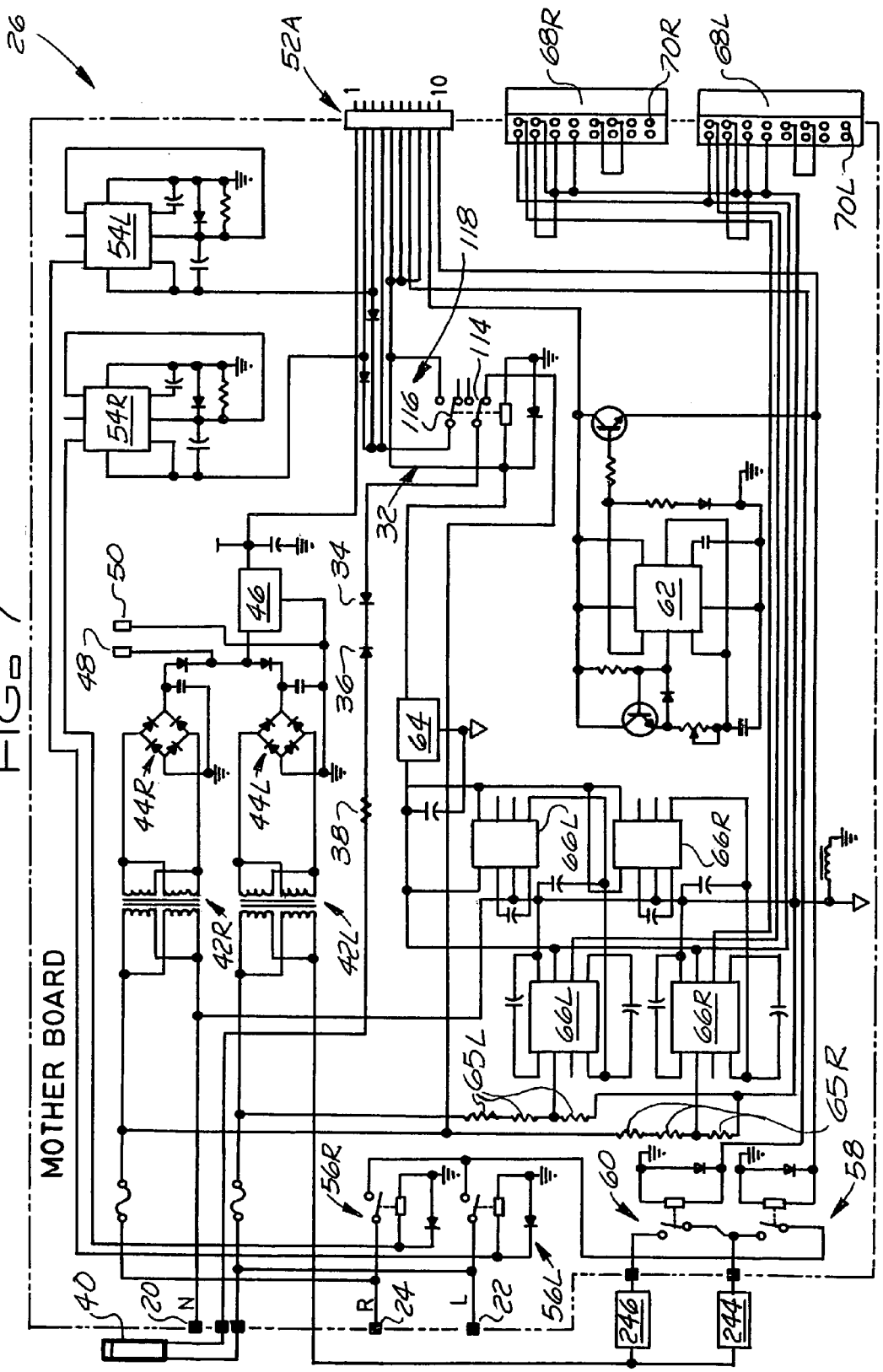
FIG. 7 is a schematic and block circuit diagram of the motherboard of the electrical circuitry of a preferred embodiment of the electrical utility service tester of the subject invention.

The electrical circuitry of the electrical utility service tester 200 includes the neutral lead 20, the left hot lead 22, and the right hot lead 24 for connecting the electrical utility service tester 200 to an electrical utility service to be tested with the electrical utility service tester 200. The electrical circuitry of the electrical utility service tester 200 also includes the motherboard 26 such as the motherboard shown schematically in FIG. 7, the sister board 28 such as the sister board shown schematically in FIG. 8, and the control switch and LED board 30 such as the control switch and LED board shown schematically in FIG. 9. The electrical utility service tester 200 is powered by the electrical utility service being tested through the connection of the electrical utility service tester neutral lead 20, left hot lead 22, and right hot lead 24 to the corresponding neutral leg, left hot leg, and right hot leg, respectively, of the electrical utility service being tested. The neutral lead 20, the left hot lead 22, and the right hot lead 24 of the electrical utility service tester 200 are connected to the motherboard 26, supplying power to the motherboard, and through the motherboard 26 supplying power to the sister board 28 and the control switch and LED board 30 as will be explained in more detail below.

A preferred embodiment of the electrical utility service tester 200 and its functions will be described below. However, it is to be understood that while the embodiment of the electrical utility service tester 200 disclosed herein is a preferred embodiment of the tester and the best mode currently contemplated by the inventor for carrying out the invention, modifications may be made to the electrical utility service tester 200 provided the modified electrical utility service tester still performs the testing functions of the electrical utility service tester 200 in substantially the same way as set forth herein to obtain substantially the same results.

The motherboard 26 of this preferred electrical utility service tester 200 includes the following electrical components and circuitry: a circuit including a relay component 32, diode 34, a 130-volt zener 36, a resistance 38, and 120-volt AC red neon light 40; a circuit including a left hot lead transformer 42L and a right hot lead transformer 42R; a left hot lead bridge rectifier 44L and a right hot lead bridge rectifier 44R; a voltage regulator 46, standoff jumpers 48 and 50, and a 10 pin header 52A connecting the motherboard 26 to a 10 pin header 52B of the control switch and LED board 30; timers 54L and 54R; relay component 56L for placing the left hot leg under test and relay component 56R for placing the right hot leg under test; relay component 58 incorporating a first load into a test, relay component 60 for incorporating a second load into a test, a pulse (flash) timer 62 for applying an intermittent load into a test; voltage regulator 64; resisters 65L and 65R and conventional AD converter components(AC to DC converter components) 66L and 66R for supplying input to conventional digital voltmeters 68L and 68R; a 16 pin header 70L for connecting the circuitry to left hot lead digital voltmeter 68L and a 16 pin header 70R for connecting the circuitry to a right hot lead digital voltmeter 68R.

The sister board 28 of this preferred electrical utility service tester 200 includes the following electrical components and circuitry: a voltage regulator 72; a voltage regulator 74; a relay component 76 for controlling, in cooperation with the left hot lead switch 88, right hot lead switch 90, and test off switch 92 of the control switch and LED board 30, power to the relay 78L of the left hot lead test circuitry and the 78R of the right hot lead test circuitry; relay components 78L and 78R for controlling power to the left and right hot lead test circuitry and, once the start switch 94 has been actuated, for bringing power to the flash and constant load circuitry; relay component 82 for controlling, once the start switch 94 has been actuated and with the flash load switch 96, the constant load switch 98, and off load switch 102 of the control switch and LED board 30, power to the flash load relay component 84 and the constant load relay component 86; flash load circuit relay component 84; and constant load circuit relay component 86.

The control switch and LED board 30 of this preferred electrical utility service tester 200 includes the following electrical components and circuitry: normally open momentary left hot lead membrane switch 88 with a red LED 89; normally open momentary right hot lead membrane switch 90 with a red LED 91, normally closed momentary test off membrane switch 92 with a green LED 93; normally open momentary start membrane switch 94 with a green LED 95; normally open momentary flash test load membrane switch 96 with a red LED 97; normally open momentary constant test load membrane switch 98 with a red LED 99; normally open momentary additional test load membrane switch 100 with a green LED 101; normally closed momentary test load off membrane switch 102 with a green LED 103. Preferably, the control switches of the control switch and LED board 30 are waterproof.

With the electrical utility service tester 200 properly connected to an electrical utility service, the circuitry of the motherboard containing the switch 114 of relay component 32, the diode 34, the 130-volt zener 36, the resistance 38, and the 120-volt AC neon light 40 functions to determine and indicate whether or not the left and right legs of the electrical utility service being tested are shorted together and whether or not there is at least a total of 130 to 135 volts present in the electrical utility service being tested. With the 130-volt zener 36 in this circuitry, an electrical connection between the left hot leg and the right hot leg of the electrical utility service being tested will not be completed through this circuitry unless there is at least 130 volts present in the electrical utility service being tested. Thus, when the left hot leg and the right hot leg of the electrical utility service being tested are shorted together or there is not a total of at least 130 to 135 volts present in the service being tested, the neon light 40 will not glow when the tester is connected to the service to indicate this condition of the electrical utility service to the technician. However, when the left hot leg and the right hot leg of the electrical utility service being tested are not shorted together and there is a total of at least 130 to 135 volts present in the service being tested, the neon light 40 will glow when the tester is connected to the service to indicate this condition of the electrical utility service to the technician.

With the electrical utility service tester 200 properly connected to an electrical utility service, the circuitry of the motherboard containing the left hot lead transformer 42L and the right hot lead transformer 42R, the left hot lead bridge rectifier 44L and the right hot lead bridge rectifier 44R, the voltage regulator 46, the standoffs 48 and 50, and the 10 pin header 52A connecting the motherboard 26 to the 10 pin header 52B of the control switch and LED board 30 functions to reduce the voltage from the electrical utility service being tested and to convert the current from the electrical utility service being tested from AC to DC for powering electrical components of the electrical utility service tester 200. The left hot lead transformer 42L and the right hot lead transformer 42R reduce the 120-volt AC power of the left hot leg and the right hot leg, respectively, of the electrical utility service being tested to 20-volt AC power. The left hot lead bridge rectifier 44L and the right hot lead bridge rectifier 44R convert the 20-volt AC power coming from the left hot lead transformer 42L and the right hot lead transformer 42R, respectively, to 17-volt DC power. The standoffs 48 (hard wire jumper) and 50 connect the 17-volt DC power coming from the bridge rectifiers 44L and 44R to the sister board 28. The voltage regulator 46 reduces the voltage of the DC power coming from the bridge rectifiers 44L and 44R from 17 volts to 12 volts. The 12-volt DC power output of the voltage regulator 46 is supplied to the sister board through the 10 pin headers 52A and 52B between the motherboard 26 and the control switch and LED board 30, a printed circuit of the control switch and LED board 30, and the 20 pin header 53A and 53B between the control switch and LED board 30 and the sister board 28.

The standoff 48 (hard wire jumper) is connected to the voltage regulator 72 of the sister board which reduces the voltage of the 17-volt DC power inputted by the standoff 48 to 12 volts. The 12-volt DC power output of the voltage regulator 46 and the 12-volt DC power output of voltage regulator 72 are supplied to the voltage regulator 74 which reduces this 12-volt DC power input to a 5-volt DC power output. When running tests on the neutral leg, the left hot leg, and/or the right hot leg of an electrical utility service being tested, this 5-volt DC power output is used for operating relay components 76, 78L, and 78R of the sister board 28 and providing power to switches 88, 90, 92, and 102 of the switch and LED board 30 and, with relay 82 actuated, for operating relay components 84 and 86 of the sister board 28 and providing power to the switches 96 and 98 of the control switch and LED board 30.

In addition to supplying power to the voltage regulator 72, the 17-volt DC power from standoff 48 is also fed to the normally open switch 104L of relay component 78L of the left hot lead test circuit and the normally open switch 104R of relay component 78R of the right hot lead test circuit. The relays and switches of the electrical circuitry powered through the switches 104L and 104R are 12-volt relays and switches and the initial 17 volts from the standoff 48 compensates for voltage loss in the circuitry. When relay component 78L of the left hot lead test circuit is actuated and switch 104L is closed, at least 12-volt DC power is supplied through the closed switch 104L to the timer 54L and relay component 56L of the motherboard to initiate a left hot leg test. When relay component 78R of the right hot lead test circuit is actuated and switch 104R is closed, a least 12-volt DC power is supplied through the switch 104R to the timer 54R and relay component 56R of the motherboard to initiate a right hot leg test. When either relay component 78L is actuated and switch 104L is closed or relay component 78R is actuated and switch 104R is closed, 12-volt DC power is also supplied through the closed switch 104L or 104R to the momentary start membrane switch 94 and to switch 116 of the relay component 32.

The left hot lead test circuit relay component 78L has a second switch 110L. When the left hot lead circuit relay component 78L is unactuated, the switch 110L of the relay component 78L completes a circuit from the relay component 76 to the momentary right hot lead membrane switch 90 and brings 5-volt DC power to the momentary right hot lead membrane switch 90 so that an actuation of the momentary right hot lead membrane switch 90 can initiate a right hot leg test. However, when the left hot lead relay component 78L has been actuated by actuating the momentary left hot lead membrane switch 88, the second switch 110L opens the circuit from the relay component 76 to the momentary right hot lead membrane switch 90 so that power is no longer supplied to the momentary right hot lead membrane switch 90 and completes a circuit from the relay component 76 to a relay control loop 112L of the relay component 78L to supply power to the loop 112L and to the LED 89 of the left hot lead membrane switch 88. With power supplied to the control loop 112L, the control loop 112L maintains the second switch 10L in position for the continued actuation of the relay component 78L until the circuit through the relay component 76 supplying power to relay control loop 112L of the relay component 78L and the LED 89 of the momentary left hot lead membrane switch 88 is momentarily interrupted by actuating the momentary test off membrane switch 92.

Figure 8:
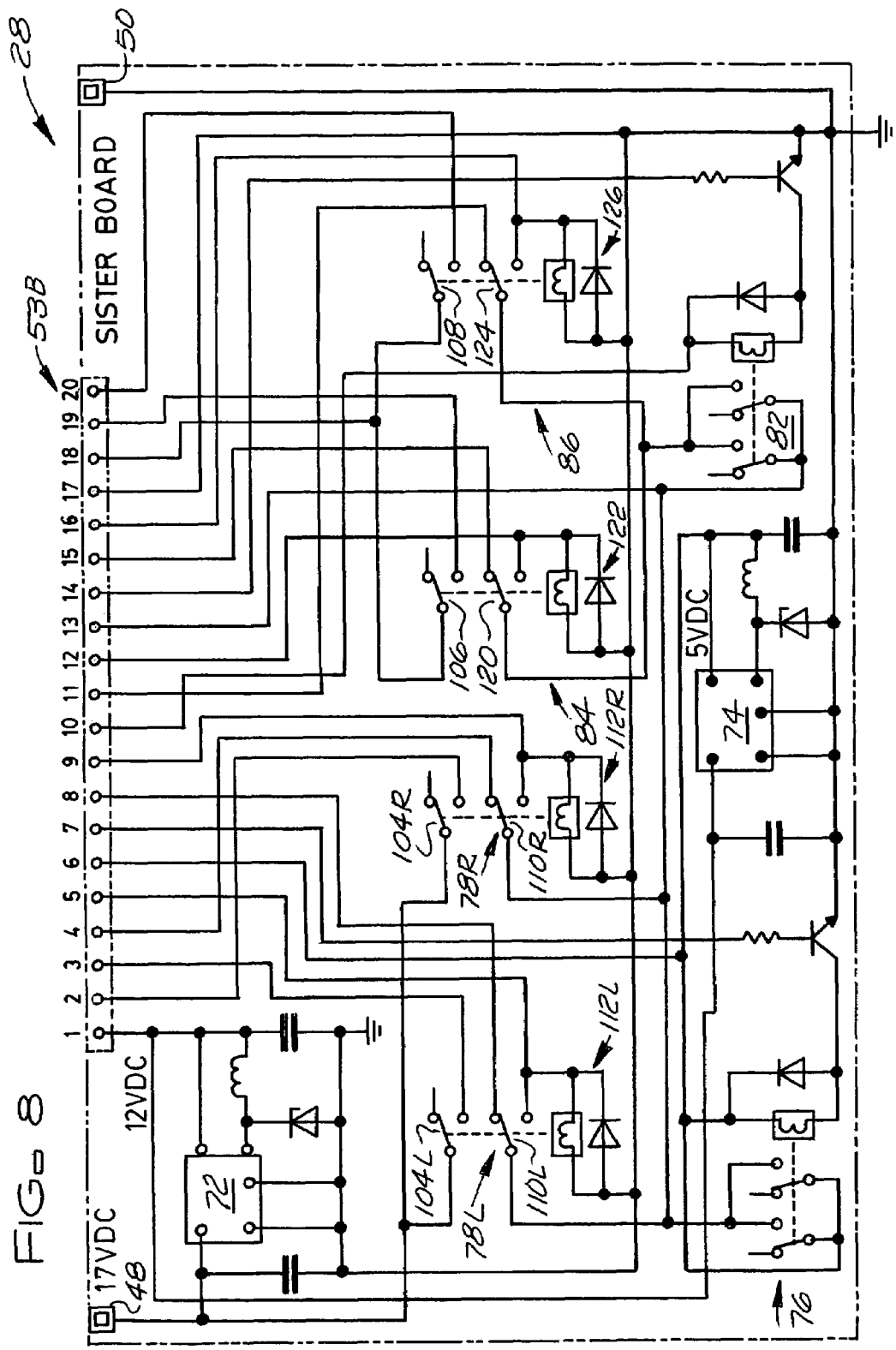
FIG. 8 is a schematic and block circuit diagram of the sister board of the electrical circuitry of a preferred embodiment of the electrical utility service tester of the subject invention.

When the power through the relay component 76 and through the second switch 110L of the relay component 78L to the relay control loop 112L of the relay component 78L is momentarily interrupted by actuating the momentary test off membrane switch 92, the relay component 78L is unactuated and the switches 104L and 110L return to their unactuated positions shown in FIG. 8 where power is no longer provided through the second switch 110L to the relay control loop 112L and the LED 89 of the left hot lead membrane switch 88 and the switch 104L is open. With the switch 104L open, power is no longer provided through the relay component 78L to the timer 54L and relay component 56L of the motherboard and power is no longer provided through the relay component 78L to the momentary start membrane switch 94 and the switch 116 of the relay component 32. If a previous actuation of the start switch 94 (enabled by the actuation of the relay component 78L) has actuated the relay component 82 and provided power to the switch 106 of the flash load test circuit relay component 84 and the switch 108 of the constant load test circuit relay component 84, with the opening of the switch 104L power is no longer supplied to the relay component 82 thereby de-actuating the relay component 82 and power is no longer supplied to the switches 106 and 108. However, with switch 110L returned to its unactuated position shown in FIG. 8, power is again supplied through the relay component 78L to the momentary right hot lead membrane switch 90. With power restored to the momentary right hot lead membrane switch 90 through the relay component 78L and power still supplied to the momentary left hot lead membrane switch 88 through the relay component 78R, either momentary switch 88 or 90 can now be actuated to initiate a test procedure.

The right hot lead test circuit relay component 78R also has a second switch 110R. When the right hot lead circuit relay component 78R is unactuated, the switch 110R of the relay component 78R completes a circuit from the relay component 76 to the momentary left hot lead membrane switch 88 and brings 5-volt DC power to the momentary left hot lead membrane switch 88 so that an actuation of the momentary left hot lead membrane switch 88 can initiate a left hot leg test. However, when the right hot lead relay component 78R has been actuated by actuating the momentary right hot lead membrane switch 90, the second switch 110R opens the circuit from the relay component 76 to the momentary left hot lead membrane switch 88 so that power is no longer supplied to the momentary left hot lead membrane switch 88 and also completes a circuit from the relay component 76 to a relay control loop 112R of the relay component 78R to supply power to the loop 112R and to the LED 91 of the right hot lead membrane switch 90. With power supplied to the control loop 112R, the control loop 112R maintains the second switch 112R in position for the continued actuation of the relay component 78R until the circuit through the relay component 76 supplying power to the control loop 112R of the relay component 78R and the LED 91 of the momentary right hot lead membrane switch 90 is momentarily interrupted by actuating the momentary test off membrane switch 92.

When the power through the relay component 76 and through the second switch 110R of the relay component 78R to the relay control loop 112R of the relay component 78R is momentarily interrupted by actuating the momentary test off membrane switch 92, the relay component 78R is unactuated and the switches 104R and 110R return to their unactuated positions shown in FIG. 8 where power is no longer provided through the second switch 110R to the relay loop 112R and the LED 91 of the right hot lead membrane switch 90 and the switch 104R is open. With the switch 104R open, power is no longer provided through the relay component 78R to the timer 54R and relay component 56R of the motherboard and power is no longer provided through the relay component 78R to the momentary start membrane switch 94 and the switch 116 of the relay component 32. If a previous actuation of the start switch 94 (enabled by the actuation of the relay component 78R) has actuated the relay component 82 and provided power to the switch 106 of the flash load test circuit relay component 84 and the switch 108 of the constant load test circuit relay component 84, with the opening of the switch 104R power is no longer supplied to the relay component 82 thereby de-actuating the relay component 82 and power is no longer supplied to the switches 106 and 108. However, with switch 110R returned to its unactuated position shown in FIG. 8, power is again supplied through the relay component 78R to the momentary left hot lead membrane switch 88. With power restored to the momentary left hot lead membrane switch 88 through the relay component 78R and power still supplied to the momentary right hot lead membrane switch 90 through the relay component 78L, either momentary switch 88 or 90 can now be actuated to initiate a test procedure.

With this control circuitry, once a test has been initiated by actuating either the momentary left hot lead membrane switch 88 or the momentary right hot lead membrane switch 90, the momentary test off membrane switch 92 must be actuated before a new test can be initiated by actuating the other momentary hot lead membrane switch 88 or 90. In addition, whenever the relay component 78L is actuated by the momentary left hot lead membrane switch 88 to supply power to the timer component 54L and the relay component 56L of the motherboard to initiate a left hot leg test or the relay component 78R is actuated by the momentary right hot lead membrane switch 90 to supply power to the timer component 54R and the relay component 56R motherboard to initiate a right hot leg test, the timer component 54L or 54R of the motherboard causes a delay (preferably at least a one second delay) in the actuation of the corresponding relay component 54L or 54R. Thus, the circuitry of the sister board 28 and control switch and LED board 30 described above, in cooperation with the timer components 54L and 54R of the motherboard 26, prevent too rapid an actuation by the technician of either relay component 56L or 56R when the technician ends the testing of one hot leg and desires to test the other hot leg of the electrical utility service being tested. As discussed in the background of the invention, to rapid an actuation of either relay component 56L or 56R, when switching from a test of one hot leg to a test of the other hot leg of the electrical utility service being tested, can send up to 240 volts through circuitry of the electrical utility service tester 200 and severely damage the circuitry of the electrical utility service tester 200.

With either the test circuitry for the left hot lead actuated by actuating the momentary left hot lead membrane switch 88 or the test circuitry for the right hot lead actuated by actuating the momentary right hot lead membrane switch 90, the actuation of the momentary membrane start switch 94 actuates relay component 32 to open the switch 114 of the relay 32 and interrupt the circuitry containing the neon light 40 so that the neon light 40, if lit, will go out. This actuation of the relay component 32 by the momentary contact membrane start switch 94 also closes the switch 116 of the relay component 32 to close a control loop 118 that keeps the relay component 32 actuated. The actuated relay component 32 supplies 12-volt DC power to the voltage regulator 64 (which reduces the voltage to 5 volts) and through the voltage regulator 64 to the AD converter components 66L and 66R and to the digital voltmeters 70L and 70R so that the left and right transformer voltages will appear on the voltmeters. The actuated relay component 32 also supplies 12-volt DC power to actuate the relay component 82 so that 5 volt DC power is now fed from the voltage regulator 74 through the relay components 76, 82, 84 and 86 to the momentary flash test load membrane switch 96 and the momentary constant test load membrane switch 98 and supplies 12-volt DC power to the switch 106 of the flash load test circuit relay component 82 and to the switch 108 of the constant load test circuit relay component 84.

Thus, when either the left hot lead test circuit is activated or the right hot lead test circuit is activated and the start membrane switch 94 has been subsequently actuated, the flash relay component 84 can be actuated by actuating the flash load switch 96 to close switch 106 of the flash relay component 84 or the constant load relay component 86 can be actuated by actuating the constant load switch 98 to close the switch 108 of the constant load relay component 86. With the switch 106 of the flash relay component 84 closed by actuating the flash load switch 96, 12-volt DC power is supplied through the closed switch 106 to the pulse timer 62 of the motherboard and from the pulse timer 62 as an intermittent 12 volt DC pulse (e.g. 3 seconds on and 3 seconds off) to intermittently actuate the load relay component 58 of the motherboard and the test load components 244 to thereby apply an intermittent load (e.g. approximately a 3200 watt load) to a test being conducted with the electrical utility service tester 200. With the switch 108 of the constant load relay component 86 closed by actuating the constant load switch 98, 12-volt DC power is supplied through the closed switch 108 to actuate load relay component 58 of the motherboard and the test load components 244 to thereby apply the constant load (e.g. approximately a 3200 watt load) to a test being conducted with the electrical utility service tester 200.

The flash relay component 84 has a second switch 120. With the relay component 82 actuated by the actuation of the start switch 94 and the flash relay component 84 unactuated, the switch 120 of the flash relay component 84 completes a circuit from the relay component 82 to the momentary constant load membrane switch 98 and brings 5-volt DC power to the momentary constant load membrane switch 98 so that an actuation of the momentary constant load membrane switch 98 initiates the application of a constant load to a test being conducted with the tester 200. However, when the flash relay component 84 has been actuated, subsequent to the actuation of the start switch 94, by actuating the momentary flash load membrane switch 96, the second switch 120 opens the circuit from the relay component 82 to the momentary constant load membrane switch 98 so that power is no longer supplied to the momentary constant load membrane switch 98 and completes a circuit from the relay component 82 to a relay control loop 122 of the relay component 84 to supply power to the loop 122. With power supplied to the control loop 122, the control loop 122 maintains the actuation of the relay component 84 until the circuit through the relay component 82 supplying power to the control loop 122 of the relay component 84 and the LED 97 momentary-control flash load switch 96 is momentarily interrupted by actuating the momentary load off membrane switch 102. With the power through the relay component 82 to the relay control loop 122 of the relay component 84 momentarily interrupted, the relay component 84 is unactuated and the switches 106 and 120 return to their unactuated positions shown in FIG. 8 where power through the switch 106 of the relay component 84 and the pulse timer 62 of the motherboard to actuate the relay component 58 is interrupted and power is again supplied through the switch 120 of the relay component 84 to the momentary constant load membrane switch 98. With power restored to the momentary constant load membrane switch 98 through the relay component 84 and power still supplied to the momentary flash load membrane switch 96 through the relay component 86, either momentary membrane switch 96 or 98 can now be actuated to apply a load to a test being conducted with the electrical utility service tester 200.

The constant load relay component 86 also has a second switch 124. With the relay component 82 actuated by the actuation of the start switch 94 and the constant load relay component 86 unactuated, the switch 124 of the constant load relay component 86 completes a circuit from the relay component 82 to the momentary flash load membrane switch 96 and brings 5-volt DC power to the momentary flash load membrane switch 96 so that an actuation of the momentary flash load membrane switch 96 initiates the application of an intermittent load to a test being conducted with the tester 200. However, when the constant load relay component 86 has been actuated, subsequent to the actuation of the start switch 94, by actuating the momentary constant load membrane switch 98, the second switch 124 opens the circuit from the relay component 82 to the momentary flash load membrane switch 96 so that power is no longer supplied to the momentary flash load membrane switch 96 and completes a circuit from the relay component 82 to a relay control loop 126 of the relay component 86 to supply power to the loop 126. With power supplied to the control loop 126, the control loop 126 maintains the actuation of the relay component 86 until the circuit through the relay component 82 supplying power to the relay component 86 and the LED 99 of the momentary-control constant load membrane switch 98 is momentarily interrupted by actuating the momentary load off membrane switch 102. With the power through the relay component 82 to the relay control loop 126 of the relay component 86 momentarily interrupted, the relay component 86 is unactuated and the switches 108 and 124 return to their unactuated positions shown in FIG. 8 where power through the switch 108 of the relay component 86 to actuate the relay component 58 of the motherboard is interrupted and power is again supplied through the switch 124 of the relay component 86 to the momentary flash load membrane switch 96. With power restored to the momentary flash load membrane switch 96 through the relay component 86 and power still supplied to the momentary constant load membrane switch 98 through the relay component 84, either momentary membrane switch 96 or 98 can now be actuated to apply a load to a test being conducted with the electrical utility service tester 200.

With this control circuitry, once an intermittent load has been applied to a test by actuating the momentary flash load membrane switch 96, the momentary load off membrane switch 102 must be actuated before the momentary constant load membrane switch 98 can be actuated to apply a constant load to the ongoing test; and once a constant load has been applied to a test by actuating the momentary constant load membrane switch 98, the momentary load off membrane switch 102 must be actuated before the momentary flash load membrane switch 96 can be actuated to apply an intermittent load to the ongoing test. However, should the technician desire to increase the test load, the technician may do so by actuating the additional load membrane switch 100 which actuates the relay component 60 and the load components 246 to thereby add an additional load to the test e.g. an additional 3200 watt load for a total of about 6400 watts. The technician must manually keep the additional load switch 100 actuated for the entire time the addition load is to be applied in the test and the additional load may be added to a test utilizing either the intermittent load or the constant load.

When the load off membrane switch 102 is actuated, the actuated relay component 84 or 86 regulating the test load of a test is returned, as described above, to its unactuated condition shown in FIG. 8. When the test off membrane switch 92 is actuated, the actuated relay component 84 or 86 for regulating the test load of a test, as well as the actuated relay component 78L and 78R for initiating a left or right hot lead test, are returned as described above to their unactuated conditions shown in FIG. 8.

With the control circuitry of the electrical utility service tester 200 described above and shown in FIGS. 7, 8, and 9, when operating the electrical utility service tester 200, the following operating procedures are followed:

1) the neutral lead 20 is connected to the neutral leg of the electrical utility service, the left hot lead 22 is connected to the left hot leg of the electrical utility service, and the right hot lead is connected to the right hot leg of the electrical utility service;

2) with the neutral lead, left hot lead, and right hot lead properly connected the neon light 40 lights when the left and right hot legs of the electrical utility service are not shorted together and the service is providing at least 130 to 135 volts of power;

3) the left or right hot lead switch 88 or 90 are then manually actuated to initiate a test which includes either the left hot leg 204 or the right hot leg 206 of the electrical utility service and neutral leg 202;

4) once either of the hot lead switches 88 or 90 has been manually actuated, the start switch 94 is manually actuated and the neon light 40, if lit goes out, and the transformer voltages will appear on the voltmeters 68L and 68R;

5) a bad neutral leg of the utility service is indicated by the tester 200 when the voltage reads higher than normal on one voltmeter and lower than normal on the other voltmeter; a bad hot leg of the utility service is indicated by the tester 200 when the voltage is normal on one voltmeter and considerably lower than normal on the other voltmeter; a bad hot leg of the utility service is also indicated by the tester when the neon light 40 does not light when the test leads are connected to the legs of the utility service as described above, but after the actuation of the start switch 94, both voltmeters show normal voltage (in this instance the voltmeters are indicating voltage from shorted hot legs);

6) on all tests, the readings on the voltmeters should be verified by applying a load to the left hot leg test and to the right hot leg test;

7) a flash (intermittent e.g. 3 seconds on and 3 seconds off) test load or constant test load may be applied in a test; the normal test load applied is about 3200 watts; by manually actuating the increased load switch 100, the test load applied can be increased to about 6400 watts for so long as the increased load switch 100 is actuated; to change from a flash test load to a constant test load in a test or to change from a constant test load to a flash test load in a test, the test load off switch 102 must be actuated before the other test load switch 96 or 98 can be actuated;

8) when a test has been applied to the neutral and one of the hot legs of the utility service and the technician desires to apply a test to the neutral and other hot leg of the utility service, the test off switch 92 must be manually actuated before the other hot lead switch 88 or 90 can be actuated; once the test off switch 92 has been manually actuated and the other hot lead switch 88 or 90 subsequently manually actuated, the start switch 94 can be manually actuated as set forth in (4) above to proceed with the testing as outlined in (4) to (7) above.

When the flash load is utilized in a test, a three second on and three second off intermittent load is applied to the neutral and hot leg selected. This function enables a technician to locate specific wires in a transformer or j-box with the use of a clamp on ammeter. The intermittent load also assists in locating the U/G secondary cable route with the use of an instrument that detects 60 cycles.

In describing the invention, certain embodiments have been used to illustrate the invention and the practices thereof. However, the invention is not limited to these specific embodiments as other embodiments and modifications within the spirit of the invention will readily electrical utility to those skilled in the art on reading this specification. Thus, the invention is not intended to be limited to the specific embodiments disclosed, but is to be limited only by the claims appended hereto.

What is claimed is:

1. An improved portable electrical utility service tester, for troubleshooting a 120/208 or 120/240, three phase or single phase alternating current electrical utility service where 120 volt hot leg leads of the electrical utility service are connected 120 volts to ground only; the tester being powered by the electrical utility service being tested, the tester comprising:

electrical test circuitry and a case for containing the electrical test circuitry;

the electrical test circuitry having a left hot lead for connecting the tester to a left hot leg of a service being tested, a right hot lead for connecting the tester to a right hot leg of a service being tested, and a neutral lead for connecting the tester to a neutral leg of a service being tested;

the electrical test circuitry including a first test circuitry for indicating, upon a connection of the tester hot and neutral leads to the corresponding hot and neutral legs of a service being tested, whether or not the left and right hot legs of a service being tested are shorted together and whether or not a service being tested is providing at least of total of 130 to 135 volts of power; the first test circuitry having a light which is lit only when the left and right hot legs of a service being tested are not shorted and a service being tested is providing at least a total of 130 to 135 volts of power;

the electrical test circuitry including a second test circuitry for indicating potential difference between the left hot leg and the neutral leg of a service being tested which includes a left hot leg to neutral leg voltmeter for providing a reading of the potential difference between the left hot leg and the neutral leg of a service being tested;

the electrical test circuitry including a third test circuitry for indicating potential difference between the right hot leg and the neutral leg of a service being tested which includes a right hot leg to neural leg voltmeter for providing a reading of the potential difference between the right hot leg and the neutral leg of a service being tested;

a left hot lead control switch which must be manually actuated for turning on the second test circuitry, a right hot lead control switch which must be manually actuated for turning on the third test circuitry, and a test off switch; the left hot lead control switch, the right hot lead control switch, and the test off control switch being interconnected by circuitry whereby once the second test circuitry has been turned on by a manual actuation of the left hot lead control switch, the test off control switch must be manually actuated before the right hot lead control switch can be manually actuated for turning on the third test circuitry and once the third test circuitry has been turned on by a manually actuation of the right hot lead control switch, the test off control switch must be manually actuated before the left hot lead control switch can be manually actuated for turning on the second test circuitry; and the second test circuitry having a timer means therein for imposing a time delay in completing activation of the second test circuitry by delaying a closing of a relay switch in the second test circuitry connecting the second test circuitry directly to the left hot lead of the electrical test circuitry when the left hot lead control switch has been manually actuated and the third test circuitry having a timer means therein for imposing a time delay in completing activation the third test circuitry by delaying a closing of a relay switch in the second test circuitry connecting the third test circuitry directly to the right hot lead of the electrical test circuitry when the right hot lead control switch has been manually actuated whereby time consumed by having to manually actuate the test off switch when turning either the second or third test circuitry off and manually actuate the other of the hot lead control switches when turning either the second or third test circuitry on and the time delay imposed by the timer of the second or third test circuit being turned on prevents having the relays of the second and third test circuitry simultaneously closed to thereby prevent damage to the electrical test circuitry of the tester by preventing the second and third test circuits from being simultaneously operative.

2. The improved portable electrical utility service tester according to claim 1, wherein:

the electrical test circuitry includes a first test load;

the electrical test circuitry includes an intermittent test load circuitry for intermittently incorporating the first test load into the second test circuitry when the second test circuitry is turned on and for intermittently incorporating first test load into the third test circuitry when the third test circuitry is turned on;

the electrical test circuitry includes a continuous test load circuitry for continuously incorporating the first test load into the second test circuitry when the second test circuitry is turned on and for continuously incorporating first test load into the third test circuitry when the third test circuitry is turned on; and a manually actuated start control switch, a manually actuated intermittent test load control switch, a manually actuated continuous test load control switch, and a manually actuated test load off switch; the start control switch being interconnected by circuitry to the second test circuitry and the third test circuitry and to the intermittent test load control switch and the continuous test load control switch whereby either the second test circuitry or the third test circuitry must be turned on, before the start control switch can be manually actuated and the start control switch must be manually actuated before the intermittent test load control switch can be manually actuated to turn on the intermittent test load circuitry or the continuous test load control switch can be manually actuated to turn on the continuous test load circuitry; and the intermittent test load control switch, the continuous test load control switch, and the test load off switch being interconnected by circuitry whereby once the intermittent test load circuitry has been turned on by the intermittent test load control switch, the test load off control switch must be manually actuated before the continuous test load control switch can be manually actuated to turn on the continuous test load circuitry and once the continuous test load circuitry has been turned on by the continuous test load control switch, the test load off control switch must be manually actuated before the intermittent test load control switch can be manually actuated to turn on the intermittent test load circuitry.

3. The improved portable electrical utility service tester according to claim 2, wherein:

the electrical test circuitry includes a second test load;

the electrical test circuitry includes second test load circuitry for incorporating the second test load into the second test circuitry when the second test circuitry is turned on and the first test load has already been incorporated into the second test circuitry and for incorporating the second test load into the third test circuitry when the third test circuitry is turned on and the first test load has already been incorporated into the third test circuitry; and a manually actuated additional test load control switch interconnected by circuitry to the second test load and the intermittent test load circuitry and the continuous test load circuitry whereby when the first test load in incorporated into the second or the third test circuitry by the intermittent load circuitry or the continuous load circuitry, the second test load can be incorporated into the second or third test circuitry by manually actuating the additional test load switch for so long as the additional test load switch is being manually actuated.

4. The improved portable electrical utility service tester according to claim 3, wherein:

the control switches are waterproof momentary membrane switches.

5. The improved portable electrical utility service tester according to claim 4, wherein:

the case for containing the electrical test circuitry of the tester is a weatherproof case with a transparent lid; the control switches and the light of the first test circuitry are visible through the transparent lid, and the case has a compartment by for storing the left hot lead, the right hot lead, and the neutral lead of the electrical test circuitry that is easily accessible by opening the lid.

6. The improved portable electrical utility service tester according to claim 1, wherein:

the case for containing the electrical test circuitry of the tester is a weatherproof case with a transparent lid; the control switches and the light of the first test circuitry are visible through the transparent lid, and the case has a compartment by for storing the left hot lead, the right hot lead, and the neutral lead of the electrical test circuitry that is easily accessible by opening the lid.

* * * * *